United States Patent
Yang et al.

(10) Patent No.: US 11,817,348 B2
(45) Date of Patent: Nov. 14, 2023

(54) METHODS FOR FORMING HOLE STRUCTURE IN SEMICONDUCTOR DEVICE

(71) Applicant: YANGTZE MEMORY TECHNOLOGIES CO., LTD., Wuhan (CN)

(72) Inventors: Gang Yang, Wuhan (CN); Xiang Hui Zhao, Wuhan (CN); Biao Zheng, Wuhan (CN); Zui Xin Zeng, Wuhan (CN); Lianjuan Ren, Wuhan (CN); Jian Dai, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 165 days.

(21) Appl. No.: 16/354,822

(22) Filed: Mar. 15, 2019

(65) Prior Publication Data
US 2020/0243373 A1 Jul. 30, 2020

Related U.S. Application Data

(63) Continuation of application No. PCT/CN2019/073086, filed on Jan. 25, 2019.

(51) Int. Cl.
*H01L 21/768* (2006.01)
*H01L 21/311* (2006.01)

(52) U.S. Cl.
CPC .... *H01L 21/7681* (2013.01); *H01L 21/31116* (2013.01); *H01L 21/31144* (2013.01); *H01L 21/76877* (2013.01)

(58) Field of Classification Search
CPC ........... H01L 21/7681; H01L 21/31116; H01L 21/31144; H01L 21/76877
See application file for complete search history.

(56) References Cited

U.S. PATENT DOCUMENTS

| 6,350,700 B1 * | 2/2002 | Schinella .......... H01L 21/31144 438/723 |
| 2001/0002331 A1 * | 5/2001 | Miyata .............. H01L 21/76811 438/618 |

(Continued)

FOREIGN PATENT DOCUMENTS

| CN | 101410844 A | 4/2009 |
| CN | 106847789 A | 6/2017 |

(Continued)

OTHER PUBLICATIONS

International Search Report issued in corresponding International Application No. PCT/CN2019/073086, dated Oct. 12, 2019, 5 pages.

(Continued)

*Primary Examiner* — Evren Seven
(74) *Attorney, Agent, or Firm* — BAYES PLLC (57) ABSTRACT

Embodiments of the present disclosure provide a method for forming a hole structure in a semiconductor device. The method includes forming a first etch mask over a stack structure, and removing a portion of the stack structure exposed by the first etch mask. The first etch mask may have a first mask opening with a first lateral dimension. The method may also include forming a second etch mask from the first etch mask. The second etch mask may have a second mask opening with a second lateral dimension that is greater than the first lateral dimension. The method may further include removing another portion of the stack structure exposed by the second etch mask to form the hole structure having a first hole portion and a second hole portion connected to and over the first hole portion.

20 Claims, 8 Drawing Sheets

(56) References Cited

U.S. PATENT DOCUMENTS

| | | | | |
|---|---|---|---|---|
| 2002/0173143 A1* | 11/2002 | Lee | ............... | H01L 21/76808 |
| | | | | 438/634 |
| 2005/0196952 A1* | 9/2005 | Genz | ............. | H01L 21/76811 |
| | | | | 257/E21.232 |
| 2009/0098716 A1 | 4/2009 | Lung | | |
| 2012/0326313 A1* | 12/2012 | Uzoh | ............. | H01L 21/76897 |
| | | | | 257/751 |
| 2015/0235864 A1* | 8/2015 | Vogt | ............... | H01L 21/31144 |
| | | | | 438/694 |

FOREIGN PATENT DOCUMENTS

| | | |
|---|---|---|
| CN | 107527918 A | 12/2017 |
| CN | 107564804 A | 1/2018 |
| TW | 200802699 A | 1/2008 |

OTHER PUBLICATIONS

Written Opinion of the International Searching Authority issued in corresponding International Application No. PCT/CN2019/073086, dated Oct. 12, 2019, 5 pages.

\* cited by examiner

METHODS FOR FORMING HOLE STRUCTURE IN SEMICONDUCTOR DEVICE

CROSS REFERENCE TO RELATED APPLICATION

This application is continuation of International Application No. PCT/CN2019/073086, filed on Jan. 25, 2019, entitled "METHODS FOR FORMING HOLE STRUCTURE IN SEMICONDUCTOR DEVICE," which is hereby incorporated by reference in its entirety.

BACKGROUND

Embodiments of the present disclosure relate to via structures and fabrication methods thereof.

Interconnects are widely used for electrically connecting elements of a semiconductor device into a functioning whole. A semiconductor device can have interconnects positioned at different levels to accommodate the layout of device components. Interconnects of different levels are often connected by vias. The fabrication of vias and wirings of these vias can be process-intensive and cost-sensitive in semiconductor manufacturing.

Dual damascene structures, introduced into semiconductor manufacturing in the 1990s, can simplify the formation of vias and the wirings by forming them in a same deposition process. In a dual damascene structure, wiring is often over and connected to the via. The via and the wiring often have different lateral dimensions.

SUMMARY

Embodiments of a hole structure and the fabrication methods to fabricate the hole structure are disclosed herein.

In one example, a method for forming a hole structure in a semiconductor device includes forming a first etch mask over a stack structure, and removing a portion of the stack structure exposed by the first etch mask. The first etch mask may have a first mask opening with a first lateral dimension. The method may also include forming a second etch mask from the first etch mask. The second etch mask may have a second mask opening with a second lateral dimension that is greater than the first lateral dimension. The method may further include removing another portion of the stack structure exposed by the second etch mask to form the hole structure having a first hole portion and a second hole portion connected to and over the first hole portion.

In another example, a method for forming a hole structure having a first hole portion and a second hole portion connected to and over the first portion in a stack structure of a semiconductor device includes determining a hard mask layer. An etching resistivity of the hard mask layer may be inversely proportional to a difference between a first lateral dimension of the first hole portion and a second lateral dimension of the second hole portion, and the first lateral dimension may be less than the second lateral dimension. The method may also include forming the hard mask layer over the stack structure, and patterning the hard mask layer to form a first patterned hard mask layer that has a first mask opening. The first mask opening may have the first lateral dimension. The method may further include removing a portion of the stack structure exposed by the first patterned hard mask layer to form an initial hole structure in the stack structure, and patterning the first patterned hard mask layer to form a second patterned mask layer that has a second mask opening. The second mask opening may have the second lateral dimension. The method may further include removing another portion of the stack structure exposed by the second patterned hard mask layer to form the hole structure.

In still another example, a method for forming a hole structure having a first hole portion and a second hole portion connected to and over the first hole portion in a semiconductor device includes forming a first etch mask over the stack structure. The first etch mask may have a first mask opening that has a first lateral dimension. The method may also include removing a portion of the stack structure exposed by the first etch mask to form an initial hole structure having an initial depth and the first lateral dimension. The initial depth may be equal to or greater than a depth of the first hole portion. The method may also include patterning the first etch mask to form a second etch mask. The first mask opening may be patterned to form a second mask opening that has a second lateral dimension, the second lateral dimension being greater than the first lateral dimension. The method may further include removing another portion of the stack structure exposed by the second etch mask to form a first initial hole portion having the first lateral dimension and a second initial hole portion having the second lateral dimension over and connected to the first initial hole portion. The method may further include performing a time-controlled etch and/or spectrum endpoint controlled etch on the first and second initial hole portions until a bottom surface of the first initial hole portion reaches an etch stop layer of the stack structure, and the first initial hole portion and the second initial hole portion each reaches a respective depth of the first hole portion and the second hole portion. The first initial hole portion and the second initial hole portion may respectively form the first hole portion and the second hole portion.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the x axis and the y axis (perpendicular to the x-z plane) extend horizontally and form a horizontal plane. The horizontal plane is substantially parallel to the top surface of the substrate. As used herein, the z axis extends vertically, i.e., along a direction perpendicular to the horizontal plane. The terms of "the x axis" and "the y axis" can be interchangeably used with "a lateral direction," "a horizontal direction" or the like, the term of "the x-y plane" can be interchangeably used with "the horizontal plane" or the like, and the term of "the z axis" can be interchangeably used with "the vertical direction" or the like.

In a semiconductor device, multiple levels of conductive layers can be formed over a substrate as interconnects between parts of different levels/elevations. As the dimensions of the semiconductor device keep shrinking, the conductive layers are also scaled down to accommodate connections between parts of reduced dimensions. A dual damascene structure is often used to connect parts arranged in a compact device layout (e.g., parts separated by a thin film). Instead of forming a via and its corresponding wiring separately, in a dual damascene structure, a via and the wiring of the via can be formed at the same time by filling a conductive material into a via hole and a wiring hole that is over and connected to the via hole, reducing the fabrication steps.

However, the formation of a dual damascene structure often requires at least two photolithography processes to form the via hole and the wiring hole, e.g., when the difference between the critical dimensions (e.g., the minimum feature sizes or lateral dimensions) of a bottom surface and a top surface of the dual damascene structure is sufficiently large. The two photolithography processes can be costly and time-consuming.

Various embodiments in accordance with the present disclosure provide the structures and fabrication methods of hole structure of a dual damascene structure used in any suitable semiconductor devices, resolving the above-noted issues associated with lengthy and costly fabrication process. According to the present disclosure, the formation of the hole structure employs a single photolithography process, reducing the time and cost to form a dual damascene structure. The single photolithography process can be performed to form a first etch mask that defines the smaller critical dimension of the dual damascene structure (e.g., the dimension of the via hole). An isotropic etching process and/or or an anisotropic etching process can be employed to enlarge the pattern features of the first etch mask and form a second etch mask. The second etch mask can then be used to define the larger critical dimension of the dual damascene structure (e.g., the dimension of the wiring hole). Only one photolithography is employed in the present disclosure to form the via hole and wiring hole of a dual damascene structure, lowering the time and cost of the fabrication process.

The methods provided in the present disclosure can be used to form hole structures in any suitable structures such as a 3D memory device or other semiconductor devices where conductive connections are formed. The methods may also be used to form via structures with more than two portions connected together, with the lateral dimension of each portion increasing upward along the z axis. In the description, the term "lateral dimension" represents any suitable dimensions formed in the fabrication process such as the critical dimensions. In the description, the term "hole structure" broadly encompasses any suitable types of openings (e.g., slit or trench) formed by the disclosed methods. The hole structure can have any suitable shapes and/or dimensions, determined by the respective application. The specific shapes, dimensions, materials, and applications of the hole structure should not be limited by the embodiments of the present disclosure.

Figure 4:
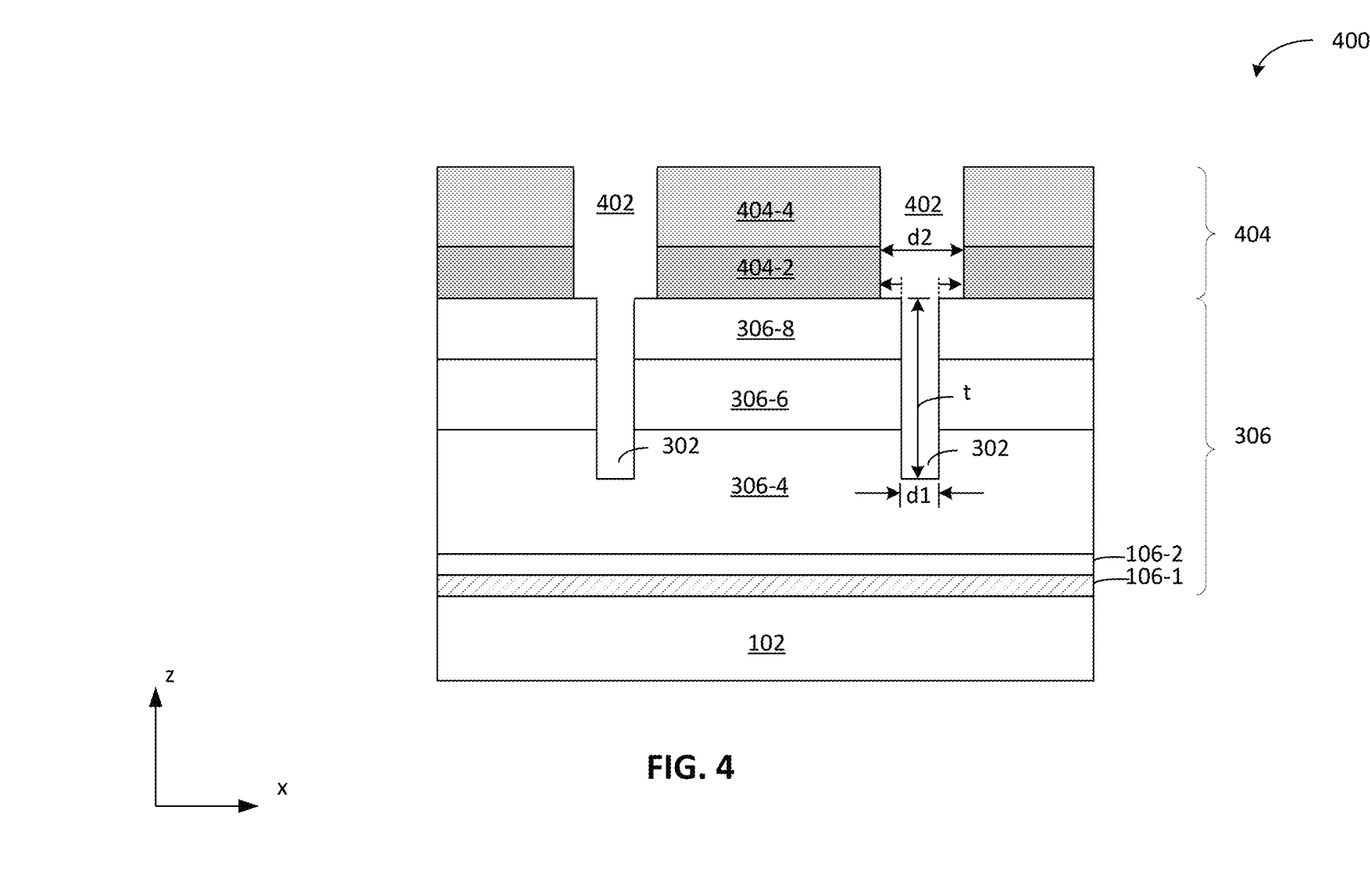
Figure 5:
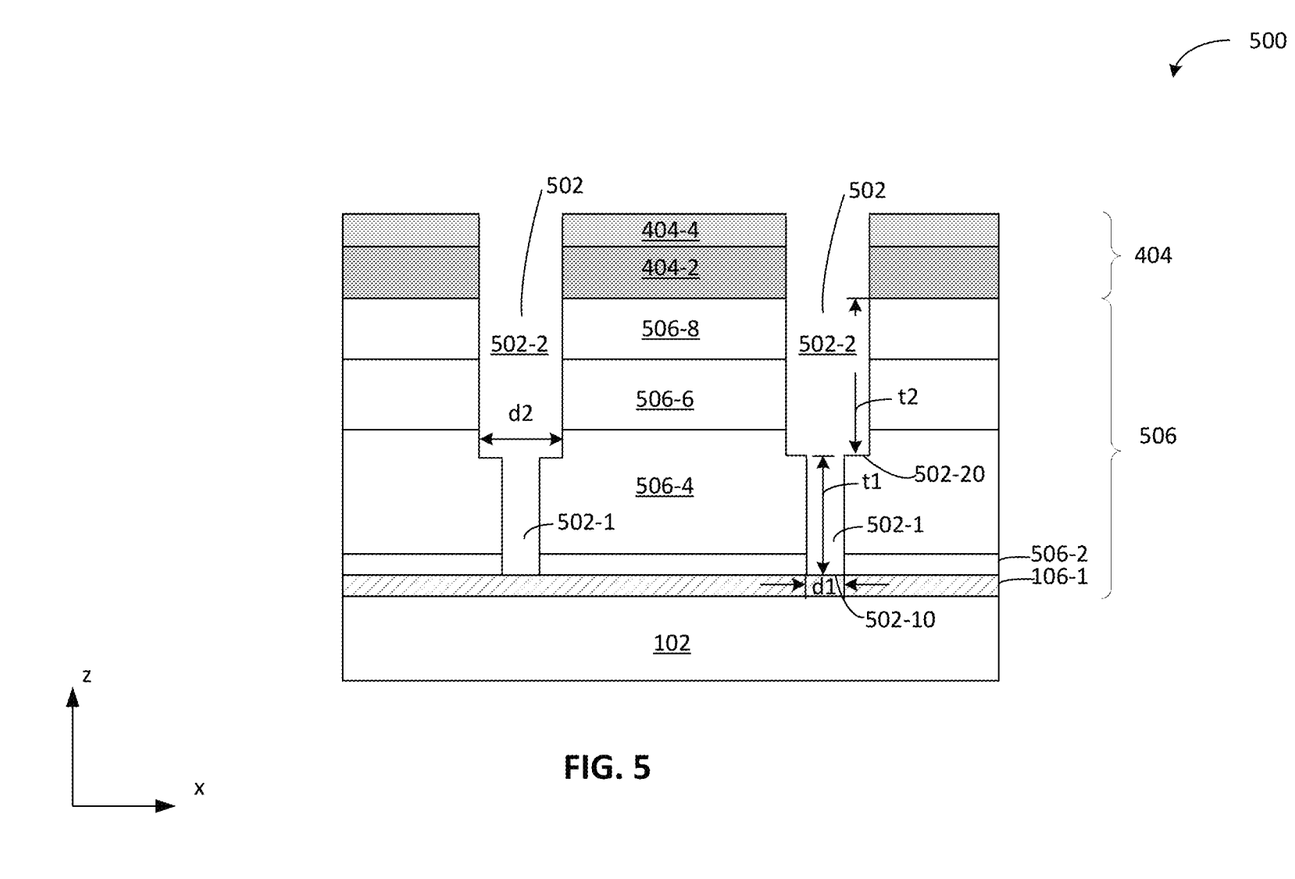
Figure 6:
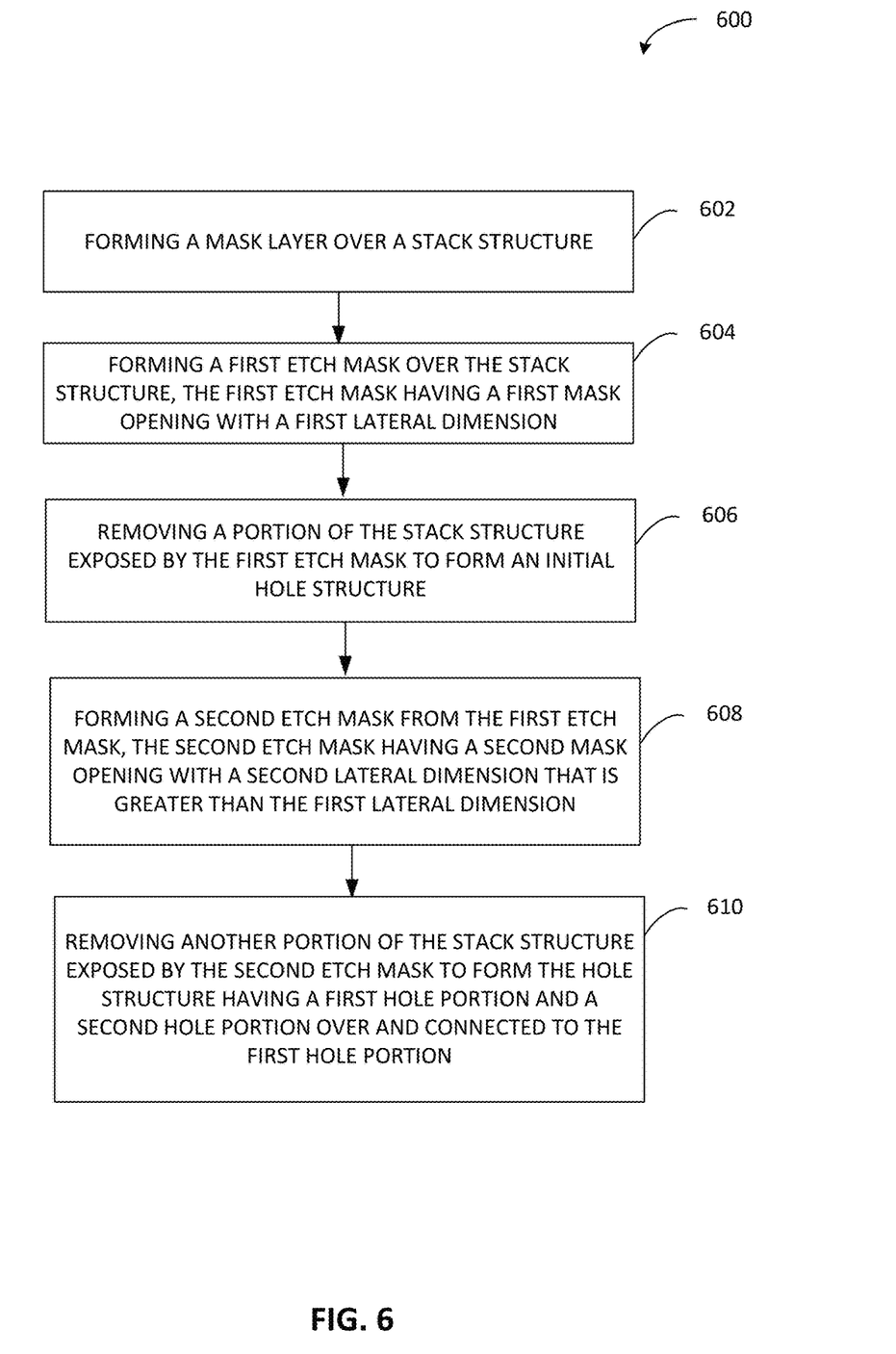
FIG. 6 illustrates a flow chart of an exemplary process for forming a hole structure, according to some embodiments of the present disclosure.
Figure 7:
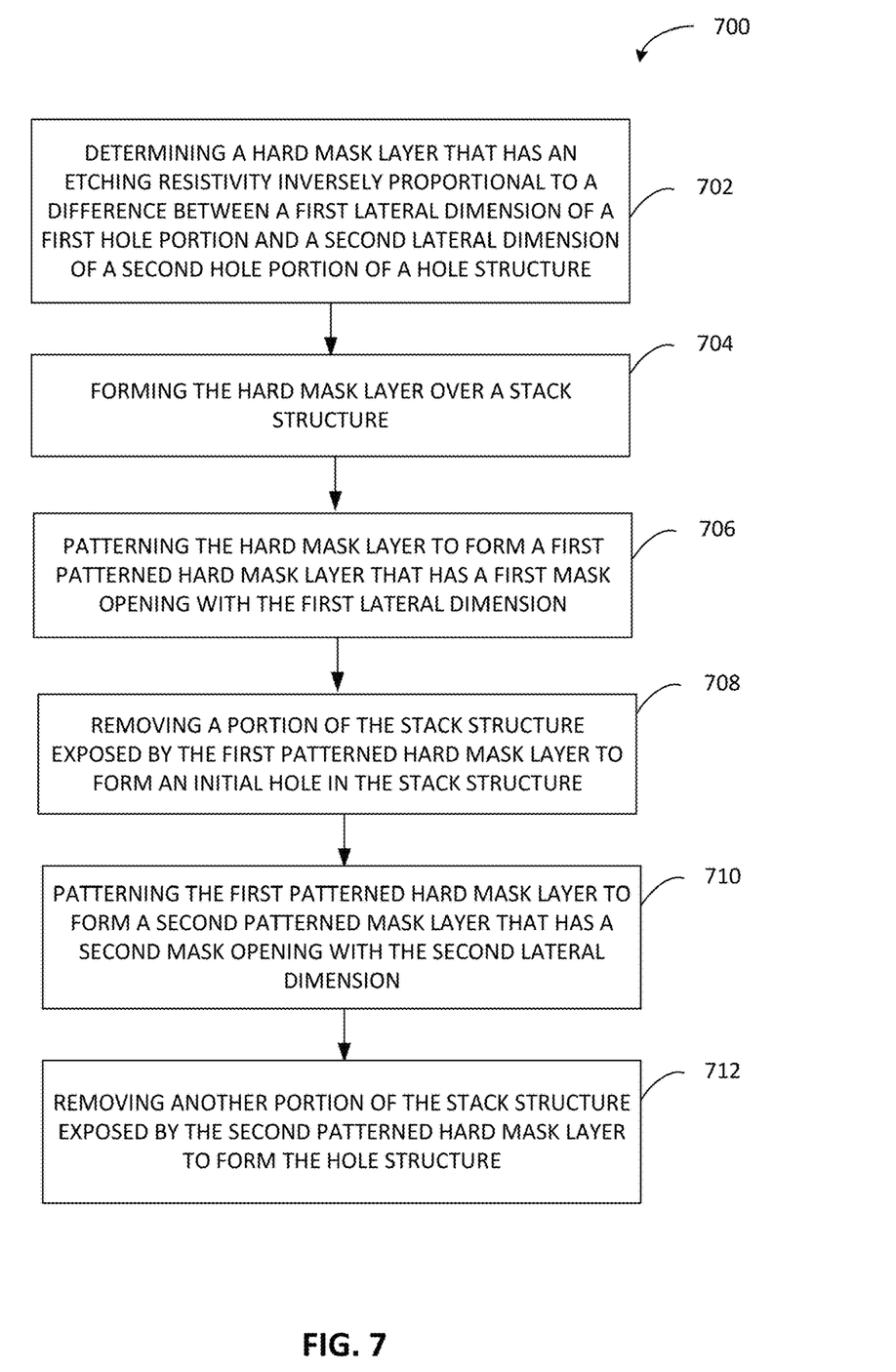
FIG. 7 illustrates a flow chart of another exemplary process for forming a hole structure, according to some embodiments of the present disclosure.
Figure 8:
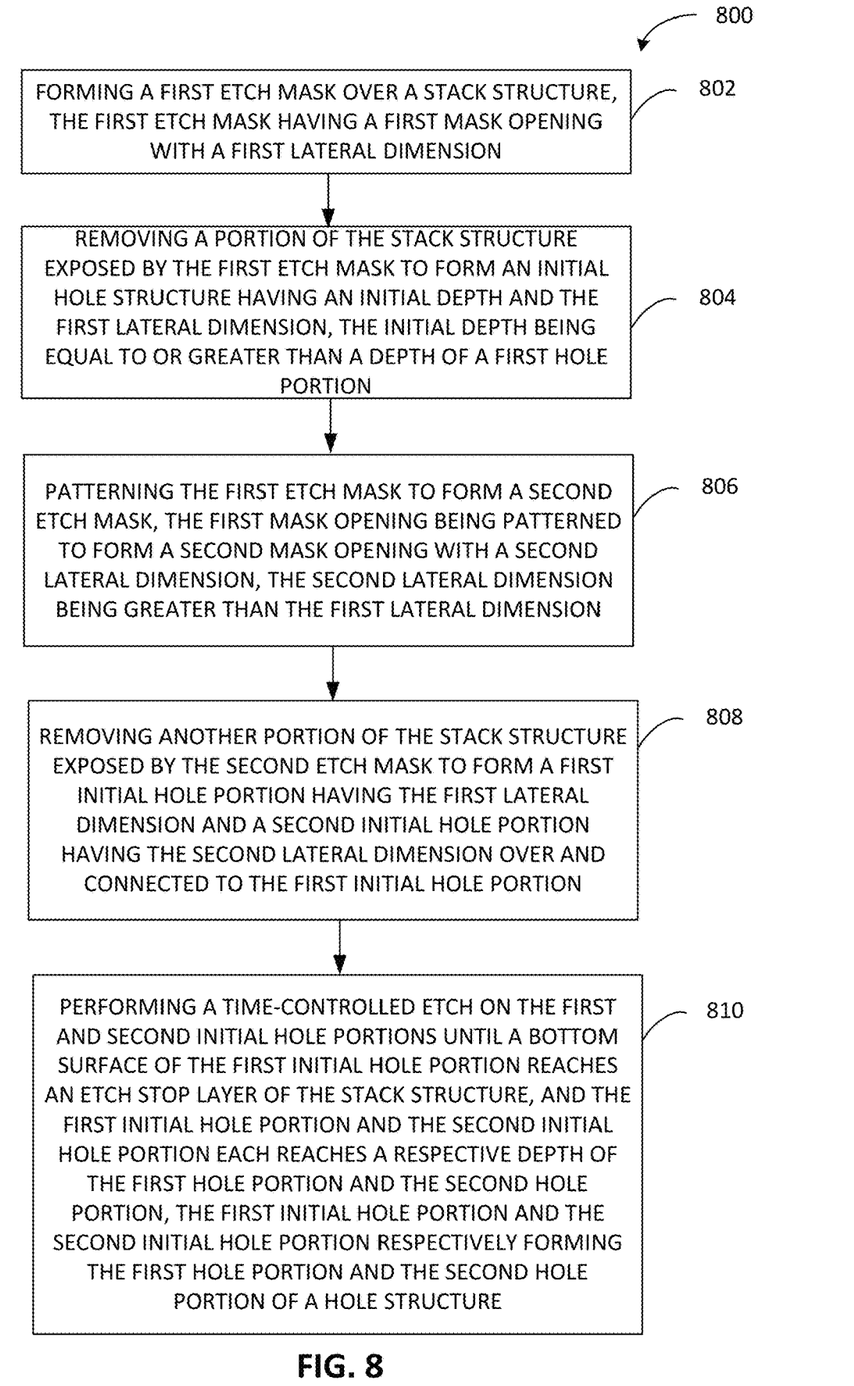
FIG. 8 illustrates a flow chart of still another exemplary process for forming a hole structure, according to some embodiments of the present disclosure.

FIGS. 1-5 each illustrates a cross-sectional view of a stack structure with a hole structure at a different stage of a fabrication process, according to some embodiments. FIGS. 6-8 each illustrates a process flow (e.g., 600, 700, and 800) to form a hole structure shown in FIGS. 1-5, according to some embodiments. The hole structure may have a first hole portion and a second hole portion over and connected to the first hole portion. The first hole portion may have a first lateral dimension, and the second hole portion may have a second lateral dimension that is greater than the first lateral dimension.

Figure 1:
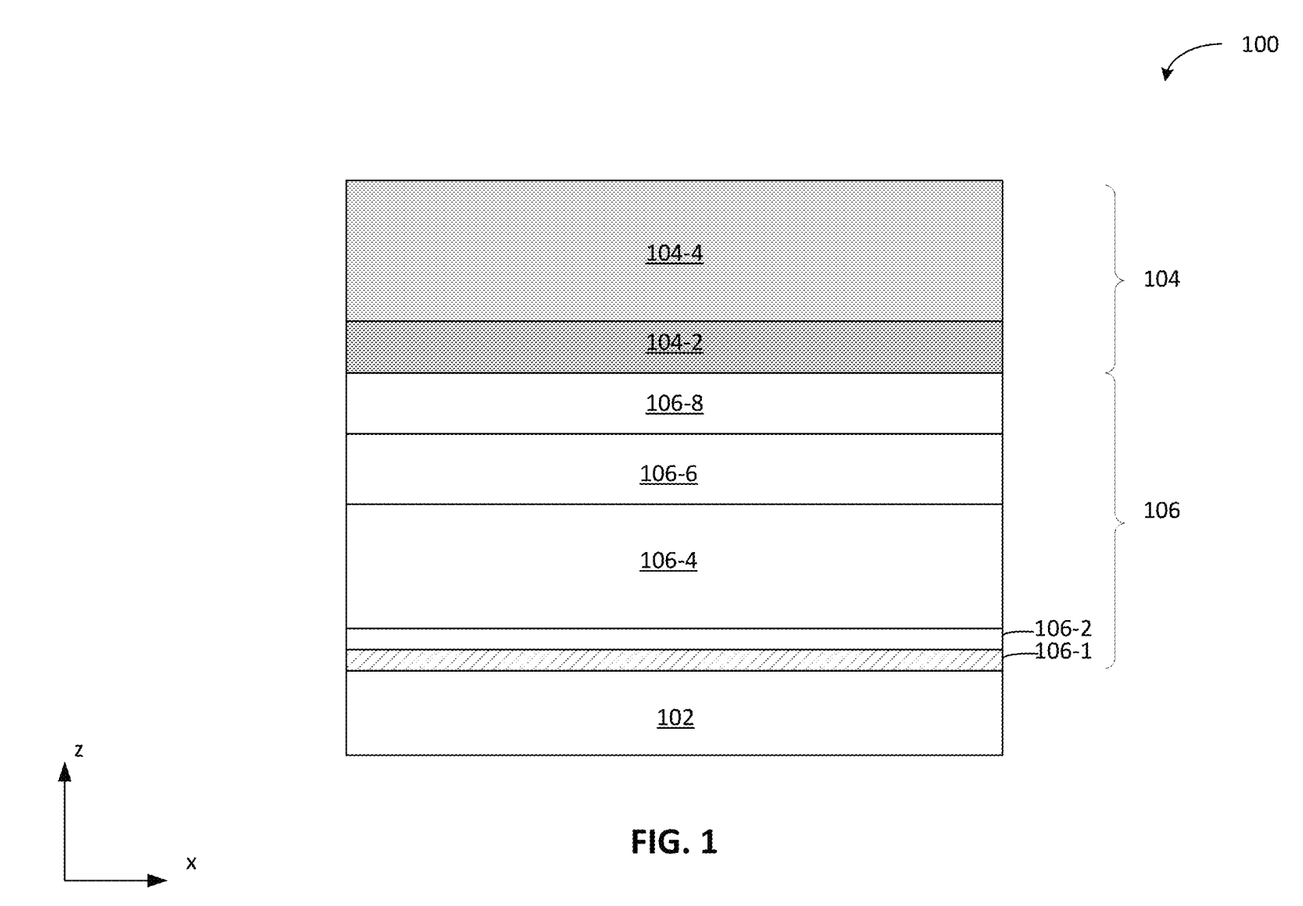
FIGS. 1-5 illustrate cross-sectional views of an exemplary stack structure at various stages of an exemplary fabrication process, according to some embodiments of the present disclosure.

Referring to FIG. 6, at the beginning of the fabrication process, a mask layer is formed over a stack structure (Operation 602). FIG. 1 illustrates a corresponding structure 100.

As shown in FIG. 1, a mask layer 104 can be formed over a stack structure 106, which is formed over a substrate 102. Mask layer 104 may include one or more soft/hard mask layers for subsequently forming etch masks. Stack structure 106 may be a single-layered structure or multiple-layered structure in which a dual damascene structure can subsequently be formed. Substrate 102 can include any structure/material that stack structure 106 is formed on. For example, substrate 102 can include a wafer, and can be made of silicon (e.g., single crystalline silicon), silicon germanium (SiGe), gallium arsenide (GaAs), germanium (Ge), silicon on insulator (SOI), glass, plastic, composite materials, and/or any other suitable materials. In some embodiments, substrate 102 includes a semiconductor wafer.

Stack structure 106 may represent any structure a dual damascene structure is formed within and may include one or more layers. Depending on different applications, a bottom surface of the dual damascene structure may be at any desired depth in stack structure 106 (e.g., over substrate 102), and stack structure 106 may include various types and arrangement of layers. In some embodiments, stack structure 106 includes an etch stop layer 106-1 at a bottom of stack structure 106. Etch stop layer 106-1 may stop an etching of stack structure 106 during a formation of the hole structure. Etch stop layer 106-1 may include an erosion resistant material such as copper (Cu), chromium (Cr), tungsten (w), cobalt (Co), aluminum (Al), polysilicon, and/or titanium (Ti). Stack structure 106 may also include one or more layers over etch stop layer 106-1. In some embodiments, stack structure 106 includes a plurality of dielectric material layers that can insulate the dual damascene structure from other parts of stack structure 106. For example, stack structure 106 includes a silicon nitride layer 106-2 over etch stop layer 106-1, a silicon oxide layer 106-4 over silicon nitride layer 106-2, a silicon nitride layer 106-6 over silicon oxide layer 106-4, and a silicon oxide layer 106-8 over silicon nitride layer 106-6.

Mask layer 104 may be a single-layered structure or a multiple-layered structure that subsequently defines the patterns and dimensions of the hole structure. Mask layer 104 may include a soft mask layer 104-4 over stack structure 106. In some embodiments, mask layer 104 further includes a hard mask layer 104-2 between soft mask layer 104-4 and stack structure 106. Soft mask layer 104-4 may be patterned to define the pattern of the hole structure in stack structure 106 and/or the pattern of hard mask layer 104-2. Hard mask layer 104-2 may be employed as an etch mask of desired etching resistivity to improve the etching uniformity of the hole structure. In some embodiments, soft mask layer 104-4 includes a photoresist layer.

Soft mask layer 104-4 may have a sufficient thickness (e.g., along the z axis or vertical direction) to sustain the etching of stack structure 106. In some embodiments, mask layer 104 does not include hard mask layer 104-2 and soft mask layer 104-4 is patterned to form the etch masks for forming the first and second hole portions of the hole structure. Soft mask layer 104-4 may be sufficiently thick to sustain the etching to form the first and second hole portions. In some embodiments, mask layer 104 includes hard mask layer 104-2. Soft mask layer 104-4 may then be sufficiently thick to sustain the etching until at least a second patterned hard mask is formed.

Hard mask layer 104-2 may have a sufficient thickness and etching resistivity to ensure the lateral dimensions of the hole structures are of desirable uniformity in stack structure 106 or at different locations of stack structure 106. The etching resistivity of soft mask layer 104-4 may be lower than the etching resistivity of hard mask layer 104-2. In some embodiments, hard mask layer 104-2 may have an etching resistivity that is inversely proportional to a difference between the first and second lateral dimensions of the hole structure. In some embodiments, hard mask layer 104-2 includes a carbon-containing material, of which the carbon content is proportionally associated with the etching resistivity of hard mask layer 104-2. In some embodiments, a higher carbon content is associated with a higher etching resistivity. As examples, when the first lateral dimension is x1% of the second lateral dimension, the carbon content of hard mask layer 104-2 can be y1; and when the first lateral dimension is x2% (x1<x2) of the second lateral dimension, the carbon content of hard mask layer 104-2 can be y2 (y2<y1). In some embodiments, hard mask layer 104-2 is sufficiently thick to sustain the etching to form the entire hole structure (e.g., the first and second hole portions). In some embodiments, hard mask layer 104-2 includes one or more of a spin-on-carbon layer, an amorphous carbon layer, and a carbon compound layer. In some embodiments, hard mask layer 104-2 may include other suitable materials of which the etching resistivity can be adjusted based on the dimensions of the hole structure, e.g., difference between the dimensions of the first and second hole portions. In some embodiments, other suitable layers may also be formed between soft mask layer 104-4 and stack structure 106 for various purposes such as reducing light reflection, improving mask strength, and so on. For example, an anti-reflective layer, a silicon nitride layer, and/or a silicon oxynitride layer may be formed between soft mask layer 104-4 and stack structure 106. The specific choices of materials of hard mask layer 104-2 should be determined based on factors such as, e.g., the dimensions of the hole structure, the fabrication conditions, and the materials of stack structure 106, and should not be limited to the embodiments of the present disclosure.

Figure 2:
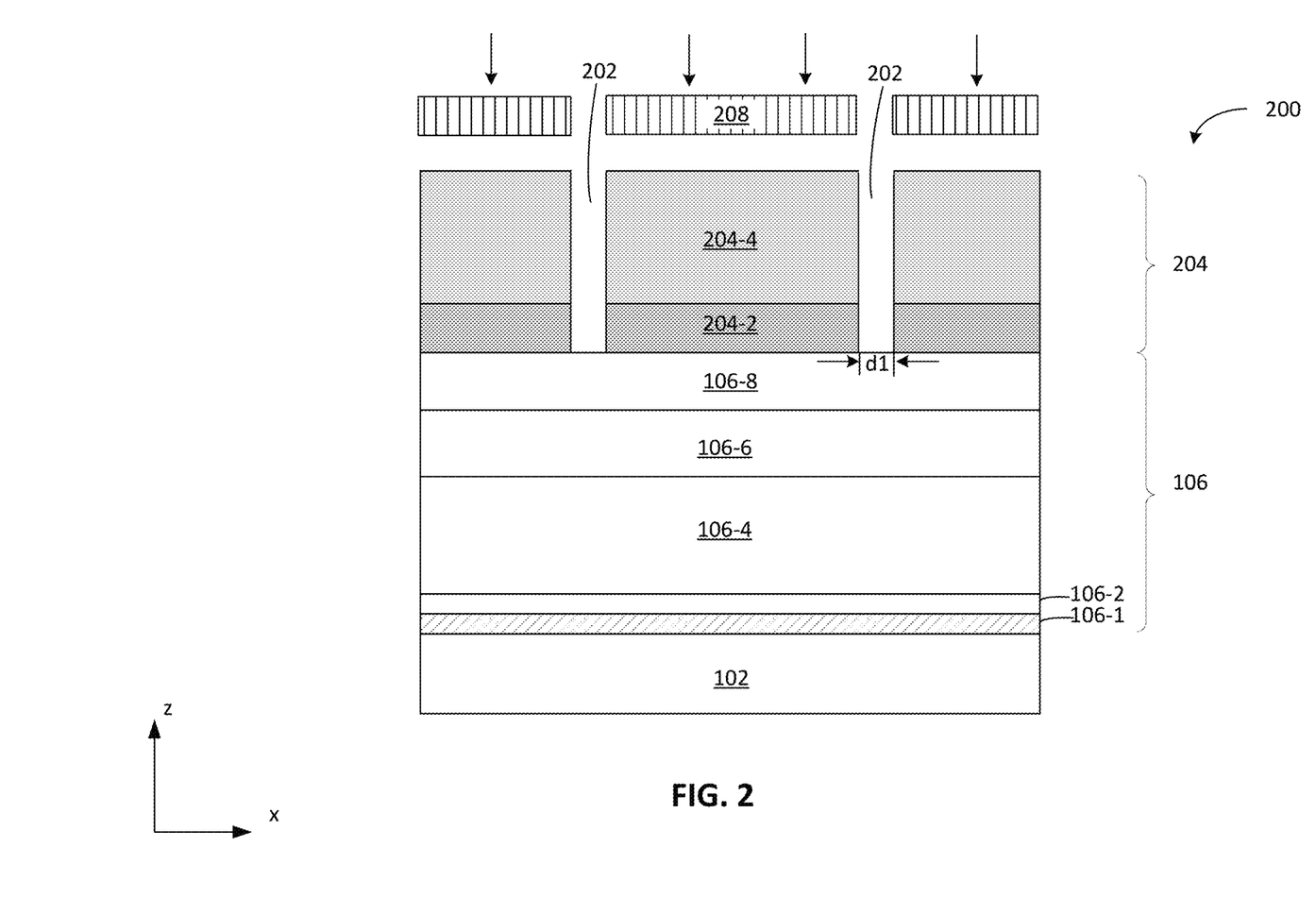

Referring back to FIG. 6, after forming the mask layer, a first etch mask is formed over the stack structure, the first etch mask having a first mask opening that has a first lateral dimension (Operation 604). FIG. 2 illustrates a corresponding structure 200.

As shown in FIG. 2, a first etch mask 204 can be formed over stack structure 106. A first mask opening 202 may be formed extending through first etch mask 204 to expose a portion of stack structure 106. A location of first mask opening 202 may correspond to a location of the first hole portion of the hole structure. A lateral dimension d1 of first mask opening 202 may be nominally the same as the lateral dimension of the first hole portion.

In some embodiments, first etch mask 204 includes a first patterned soft mask layer 204-4 of a patterned photoresist layer and is formed by a photolithography process. A lithography mask 208 (e.g., having chromium pattern printed on quartz) printed with the pattern to form first mask openings 202 may be applied over mask layer 104. In some embodiments, soft mask layer 104-4 includes a positive photoresist. Portions of mask layer 104 that to be retained may be covered by shaded areas (e.g., quartz printed with chromium) of lithography mask 208, and portions of mask layer 104 for forming first mask opening 202 may be covered by clear areas (e.g., quartz) of lithography mask 208. In some embodiments, ultra violet light (indicated by the arrows) may be incident on mask layer 104 for exposure. After the exposure, mask layer 104 may be developed to remove portions of mask layer 104 exposed by lithography mask 208 to form first mask opening 202. In some embodiments, a lateral dimension (e.g., width or diameter) of first mask opening 202 along the x axis is approximately d1, which is nominally the same as the first lateral dimension of first hole portion of the hole structure.

In some embodiments, first etch mask 204 also includes a first patterned hard mask layer 204-2 that includes a carbon-containing material. First patterned hard mask layer 204-2 may be formed by a suitable etching process using first patterned soft mask layer 204-4 as the etch mask. In some embodiments, first patterned soft mask layer 204-4 may expose portions of hard mask layer 104-2 to be removed for forming first mask opening 202. A suitable anisotropic etching process, e.g., dry etch (inductively coupled plasma (ICP) etch and/or reactive ion etch (RIE)) may be performed to remove portions of hard mask layer 104-2 to form first patterned hard mask layer 204-2. First mask opening 202, including a portion in first patterned soft mask layer 204-4 and another portion in first patterned hard mask layer 204-2, may be formed accordingly.

Figure 3:
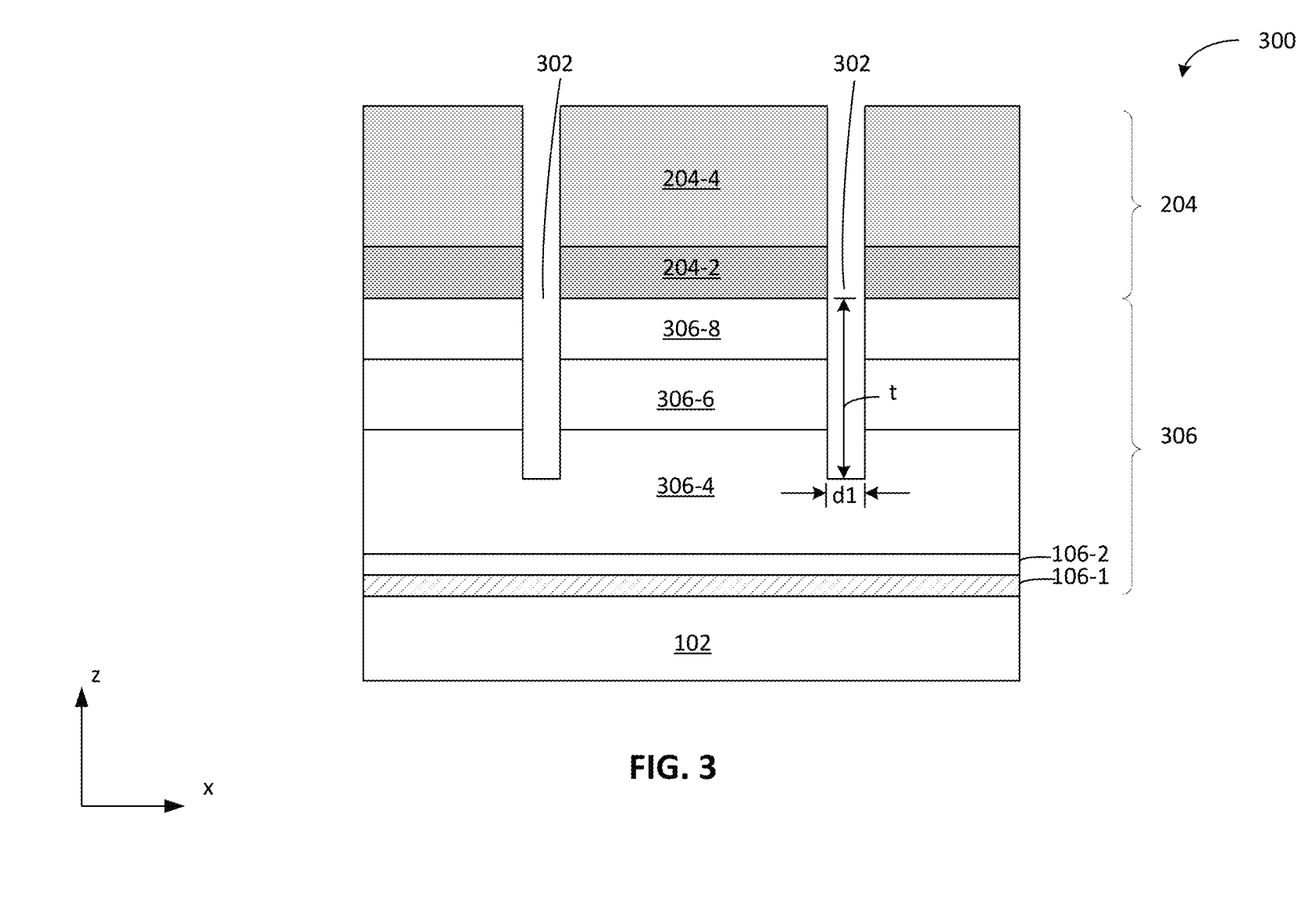

Referring back to FIG. 6, after the formation of first etch mask, a portion of the stack structure exposed by the first etch mask is removed to form an initial hole structure (Operation 606). FIG. 3 illustrates a corresponding structure 300.

As shown in FIG. 3, a portion of stack structure 106, exposed by first etch mask 204, may be removed to form an initial hole structure 302 and a stack structure 306. Stack structure 306 may include etched layers (e.g., 306-4, 306-6, and 306-8) caused by the formation of initial hole structure 302. Initial hole structure 302 may extend in stack structure 306 (e.g., extend through one or more layers) and a bottom surface of initial hole structure 302 may be at any suitable position in stack structure 306. In some embodiments, the bottom surface of initial hole structure 302 may be over etch stop layer 106-1. In some embodiments, an initial depth t of initial hole structure 302 may be equal to or greater than a depth of the first hole portion. A suitable anisotropic etching process, e.g., dry etch (ICP etch and/or RIE), may be performed using first etch mask 204 as the etch mask to remove portions of stack structure 106 and form initial hole structure 302. An etching time of the etching process may be controlled so a desired initial depth t can be obtained. In some embodiments, first patterned soft mask layer 204-4 after the formation of initial hole structure 302 may be sufficiently thick to form a second patterned hard mask (described below).

Referring back to FIG. 6, after the formation of the initial hole structure, a second etch mask is formed from the first etch mask, the second etch mask having a second mask opening with a second lateral dimension that is greater than the first lateral dimension (Operation 608). FIG. 4 illustrates a corresponding structure 400.

As shown in FIG. 4, second etch mask 404 may be formed from first etch mask 204. Second etch mask 404 may include a second mask opening 402 that has a lateral dimension of about second lateral dimension d2. Second mask opening 402 may extend through second etch mask 404 and expose the underlying structure/layer (e.g., initial hole structure 302 and a portion of stack structure 306 surrounding initial hole structure 302, or first patterned hard mask layer 204-2). Second mask opening 402 may be formed by enlarging first mask opening 202 (e.g., having first lateral dimension d1) laterally or horizontally to form second mask opening 402 (e.g., having second lateral dimension d2). In some embodiments, second patterned soft mask layer 404-4 is formed by an isotropic etching process and/or an anisotropic etching process that removes portions of second etch mask 404 laterally and/or vertically. The removal of portions of second patterned soft mask layer 404-4 is depicted by the arrows pointing along lateral directions in second mask opening 402.

Second etch mask 404 may include a second patterned soft mask layer 404-4. In some embodiments, second patterned soft mask layer 404-4 includes a patterned photoresist layer that is formed by an oxygen plasma etching process that removes portions of first patterned soft mask layer 204-4 laterally and vertically to form second patterned soft mask layer 404-4. In the oxygen plasma etching process, oxygen gas may be employed to bombard and react with (e.g., oxidize) first patterned soft mask layer 204-4. Photoresist of first patterned soft mask layer 204-4 may be broken down to volatile and/or small molecules that are then removed by the vacuum/pumping system structure 300 is placed in. The oxygen plasma etching process may etch/trim first patterned soft mask layer 204-4 along various different directions. Accordingly, first mask opening 202 may be enlarged laterally until second mask opening 402 with second lateral dimension d2 is formed. In some embodiments, the time of the oxygen plasma etching process is controlled so the etching of first patterned soft mask layer 204-4 may stop when first mask opening 202 is enlarged to second mask opening 402. In some embodiments, a sidewall of second mask opening 402 may be vertical (e.g., nominally straight along the z axis) and may have little or no undercut using the oxygen plasma etching process. In some embodiments, second mask opening 402 has an tapered cross-sectional shape, e.g., a lateral width of second mask opening 402 gradually decreases from top to bottom along the z axis. In some embodiments, second patterned soft mask layer 404-4 is employed as an etch mask for the formation of a second patterned hard mask layer, and has sufficient thickness (e.g., along the z axis) to sustain the subsequent etching process until the second patterned hard mask layer is formed.

In some embodiments, second etch mask 404 includes a second patterned hard mask layer 404-2. Second patterned hard mask layer 404-2 may be formed by removing portions of first patterned hard mask layer 204-2 using second patterned soft mask layer 404-4 as the etch mask with a suitable etching process such as a dry etch (e.g., ICP etch and/or RIE). Second patterned hard mask layer 404-2 may then expose initial hole structure 302 and a portion of stack structure 306 surrounding initial hole structure 302. In some embodiments, second patterned hard mask layer 404-2 is employed as an etch mask for the formation of the hole structure, and has sufficient thickness (e.g., along the z axis) to sustain the subsequent etching process until the hole structure is formed.

Referring back to FIG. 6, after the formation of second etch mask, another portion of the stack structure exposed by the second etch mask is removed to form the hole structure having a first hole portion and a second hole portion over and connected to the first hole portion (Operation 610). FIG. 5 illustrates a corresponding structure 500.

As shown in FIG. 5, another portion of stack structure 306 exposed by second etch mask 404 is removed to form hole structure 502 that has a first hole portion 502-1 and a second hole portion 502-2 over and connected to first hole portion 502-1. The removal of the other portion of stack structure 306 may form stack structure 506 with hole structure 502 extending in one or more of its etched layers (e.g., 506-2, 506-4, 506-6, and 506-8). First hole portion 502-1 may have first lateral dimension d1 and a first depth t1, and second hole portion 502-2 may have second lateral dimension d2 and a second depth t2. In some embodiments, hole structure 502 may extend through layers 506-2, 506-4, 506-6, and 506-8 and a bottom surface of first hole portion may be in contact of etch stop layer 106-1. First depth t1 may be less than or equal to initial depth t of initial hole structure 302.

Hole structure 502 may be formed by etching stack structure 306 using second etch mask 404 as the etch mask, to form a first initial hole portion from initial hole structure 302 and a second initial hole portion over and connected to the first initial hole portion. The first initial hole portion may have first lateral dimension d1, and the second initial hole portion may have second lateral dimension d2. As stack structure 306 is being etched, bottom surface 502-10 of the first initial hole portion continues to move downward until reaching etch stop layer 106-1. Meanwhile, a bottom surface 502-20 of second initial hole portion 502-2 may also move downward as the etching process continues. The time of the etching process may be controlled so that bottom surface 502-20 of second initial hole portion 502-2 may stop at a desired position so a depth of second initial hole portion (e.g., the vertical distance between a top surface of stack structure 506 and bottom surface 502-20 of second initial hole portion) may reach t2 and a depth of first initial hole portion (e.g., the vertical distance between bottom surface 502-20 of second initial hole portion and bottom surface 502-10 of first initial hole portion) may reach t1. Accordingly, the first initial hole portion may form first hole portion 502-1, and the second initial hole portion may form second hole portion 502-2. In some embodiments, an anisotropic etching process such as a dry etch (e.g., ICP etch and/or RIE) may be performed to form hole structure 502.

In some embodiments, the bottom surface of first hole portion 502-1 may be over (e.g., having no contact with) etch stop layer 106-1. Depth t1 of first hole portion 502-1 may be nominally equal to initial depth t of initial hole structure 302. Depth t2 of second hole portion 502-2 may be determined by controlling the etching time of stack structure 306. In some embodiments, stack structure 106 may not include etch stop layer 106-1, and the depths of first and second hole portions 502-1 and 502-2 may be determined by controlling the etching times of stack structures 306. The specific depths of initial hole structure 302, first hole portion 502-1, and second hole portion 502-2 should be determined based on different applications/final structures of the dual damascene structure to be formed and should not be limited by the embodiments of the present disclosure.

In some embodiments, second etch mask 404 is removed and a conductive material including, but not limited to, tungsten (W), cobalt (Co), copper (Cu), aluminum (Al), polycrystalline silicon (polysilicon), doped silicon, silicides, or any combination thereof, is deposited into hole structure 502 to form a dual damascene structure.

Embodiments of the present disclosure also provide another method 700 to form a hole structure, as illustrated in FIG. 7. The hole structure (e.g., 502) may have a first hole portion (e.g., 502-1) having a first lateral dimension (e.g., d1) and a first depth (e.g., t1), and a second hole portion (e.g., 502-2) having a second lateral dimension (e.g., d2) and a second depth (e.g., t2). The second hole portion may be over and connected to first hole portion.

At operation 702, a hard mask layer (e.g., 104-2) may be determined. The hard mask layer may have an etching resistivity inversely proportional to a difference between the first lateral dimension and the second lateral dimension. In some embodiments, the hard mask layer is determined to include a carbon-containing material in which the carbon content is proportionally associated with the etching resistivity of the hard mask layer. At operation 704, the hard mask layer may be formed over a stack structure (e.g., 106). At operation 706, the hard mask layer may be patterned to form a first patterned hard mask layer (e.g., 204-2) having a first mask opening (e.g., 202). The first mask opening may have the first lateral dimension (e.g., d1). In some embodiments, the hard mask layer is patterned by etching the hard mask layer using a first patterned soft mask layer (e.g., 204-4) as the etch mask. At operation 708, a portion of the stack structure exposed by the first patterned hard mask layer may be removed to form an initial hole structure (e.g., 302) in the stack structure. At operation 710, the first patterned hard mask layer may be patterned to form a second patterned mask layer (e.g., 404-2) that has a second mask opening (e.g., 402) with the second lateral dimension (e.g., d2). In some embodiments, the first patterned hard mask layer is patterned by etching the first patterned hard mask layer using a second patterned soft mask layer as the etch mask. The second patterned soft mask layer may be formed from the first patterned soft mask layer by performing an isotropic etching process and/or an isotropic etching process on the first patterned soft mask layer to enlarge the first mask opening (e.g., laterally) and form the second mask opening. In operation 712, another portion of the stack structure exposed by the second patterned hard mask layer may be removed to form the hole structure (e.g., 502). In some embodiments, the portion of the stack structure exposed by the second patterned hard mask layer is removed by an anisotropic etching process using the second patterned hard mask layer as the etch mask. The etching time of the stack structure may be controlled so the first and second portions (e.g., 502-1 and 502-2) of the hole structure can have desired depths (e.g., t1 and t2).

Embodiments of the present disclosure also provide another method 800 to form a hole structure, as illustrated in FIG. 8. The hole structure (e.g., 502) may have a first hole portion (e.g., 502-1) having a first lateral dimension (e.g., d1) and a first depth (e.g., t1), and a second hole portion (e.g., 502-2) having a second lateral dimension (e.g., d2) and a second depth (e.g., t2). The second lateral dimension may be greater than the first lateral dimension. The second hole portion may be over and connected to first hole portion.

At operation 802, a first etch mask (e.g., 204) may be formed over a stack structure (e.g., 106), the first etch mask having a first mask opening (202) with the first lateral dimension (e.g., d1). At operation 804, a portion of the stack structure exposed by the first etch mask may be removed to form an initial hole structure (e.g., 302) having an initial depth (e.g., t) and the first lateral dimension. The initial depth of the initial hole structure may be equal to or greater than the first depth (e.g., t1). At operation 806, the first etch mask may be patterned to form a second etch mask (e.g., 404). The first mask opening may be patterned to form a second mask opening (e.g., 402) with the second lateral dimension (e.g., d2). In some embodiments, the patterning of the first etch mask includes performing an isotropic etching process and/or an anisotropic etching process to enlarge the first mask opening (e.g., laterally) and form the second mask opening. The etching time of the may be controlled so the second mask opening may be formed from the first mask opening. At operation 808, another portion of the stack structure exposed by the second etch mask may be removed to form a first initial hole portion having the first lateral dimension and a second initial hole portion having the second lateral dimension. The second initial hole portion may be over and connected to the first initial hole portion. At operation 810, a time-controlled etching process and/or a spectrum endpoint controlled etching process (e.g., an etching process of which a stop point is detected by an optical emission spectroscopy) may be performed on the first and second initial hole portions until a bottom surface of the first initial hole portion (e.g., 502-10) reaches an etch stop layer (e.g., 106-1) of the stack structure, and the first and second initial hole portions each reaches a respective depth (e.g., t1 and t2) of the first and second hole portions (e.g., 502-1 and 502-2). The first initial hole portion and the second initial hole portion may then respectively form the first and second hole portion of the hole structure.

In some embodiments, a method for forming a hole structure in a semiconductor device includes forming a first etch mask over a stack structure, and removing a portion of the stack structure exposed by the first etch mask. The first etch mask may have a first mask opening with a first lateral dimension. The method may also include forming a second etch mask from the first etch mask. The second etch mask may have a second mask opening with a second lateral dimension that is greater than the first lateral dimension. The method may further include removing another portion of the stack structure exposed by the second etch mask to form the hole structure having a first hole portion and a second hole portion connected to and over the first hole portion.

In some embodiments, removing the portion of the stack structure exposed by the first etch mask includes etching the stack structure using the first etch mask as a respective etch mask to form an initial hole structure extending in the stack structure.

In some embodiments, removing another portion of the stack structure exposed by the second etch mask includes etching the stack structure using the second etch mask as a respective mask to form a first initial hole portion from the initial hole structure and a second initial hole portion connected to and over the first initial hole portion.

In some embodiments, removing another portion of the stack structure exposed by the second etch mask further includes etching the stack structure until a bottom surface of the first initial hole portion reaches an etch stop layer of the stack structure and a depth of the second initial hole portion reaches a depth of the second hole portion. The first initial hole portion may form the first hole portion and the second initial hole portion may form the second hole portion.

In some embodiments, removing the portion and removing another portion of the stack structure each includes an anisotropic etching process.

In some embodiments, the anisotropic etching process includes a dry etch.

In some embodiments, forming the second etch mask from the first etch mask includes performing an isotropic etching process and/or an anisotropic etching process to increase the first lateral dimension to the second lateral dimension.

In some embodiments, forming the first etch mask over the stack structure includes forming a photoresist layer over the stack structure and patterning the photoresist layer to form the first etch mask. In some embodiments, performing the patterning process (e.g., an isotropic etching process and/or an anisotropic etching process) includes performing an oxygen plasma etching process on the first etch mask.

In some embodiments, forming the first etch mask over the stack structure further includes forming a hard mask layer between the photoresist layer and the stack structure, patterning the photoresist layer to form a first patterned photoresist layer, and removing portions of the hard mask layer exposed by the first patterned photoresist layer to form a first patterned hard mask layer. In some embodiments, forming the second etch mask from the first etch mask further includes patterning the first pattered photoresist to form a second patterned photoresist layer and removing portions of the first patterned hard mask layer exposed by the second patterned photoresist layer to form a second patterned hard mask layer.

In some embodiments, forming the first etch mask and forming the second etch mask include patterning the photoresist layer using a single photolithography process.

In some embodiments, forming the second etch mask does not include a photolithography process.

In some embodiments, a method for forming a hole structure having a first hole portion and a second hole portion connected to and over the first portion in a stack structure of a semiconductor device includes determining a hard mask layer. An etching resistivity of the hard mask layer may be inversely proportional to a difference between a first lateral dimension of the first hole portion and a second lateral dimension of the second hole portion, and the first lateral dimension may be less than the second lateral dimension. The method may also include forming the hard mask layer over the stack structure, and patterning the hard mask layer to form a first patterned hard mask layer that has a first mask opening. The first mask opening may have the first lateral dimension. The method may further include removing a portion of the stack structure exposed by the first patterned hard mask layer to form an initial hole structure in the stack structure, and patterning the first patterned hard mask layer to form a second patterned mask layer that has a second mask opening. The second mask opening may have the second lateral dimension. The method may further include removing another portion of the stack structure exposed by the second patterned hard mask layer to form the hole structure.

In some embodiments, patterning the first patterned hard mask layer includes patterning the first patterned hard mask layer to increase the first lateral dimension to the second lateral dimension.

In some embodiments, determining the hard mask layer includes determining a carbon content of a carbon-containing material as the hard mask layer. The carbon content increases as the etching resistivity increases.

In some embodiments, forming the hard mask layer over the stack structure includes forming a spin-on-carbon layer, an amorphous carbon layer, a carbon compound layer, or a combination thereof.

In some embodiments, removing the portion and removing another portion of the stack structure each includes an anisotropic etch.

In some embodiments, the method further includes forming a soft mask layer over the hard mask layer before patterning the hard mask layer. An etch resistivity of the soft mask layer may be lower than the etch resistivity of the hard mask layer. The method may also include patterning the soft mask layer to form a first patterned soft mask layer, removing portions of the hard mask layer exposed by the first patterned soft mask layer to form the first patterned hard mask layer, patterning the first patterned soft mask layer to form a second patterned soft mask layer, and removing portions of the first patterned hard mask layer exposed by the second patterned soft mask layer form the second patterned hard mask layer.

In some embodiments, forming the soft mask layer includes coating a photoresist layer, and patterning the soft mask layer and patterning the first patterned soft mask layer each comprises a photolithography process.

In some embodiments, forming the hard mask layer further includes forming, between the soft mask layer and the stack structure, an anti-reflective layer, a silicon nitride layer, a silicon oxynitride layer, or a combination.

In some embodiments, a method for forming a hole structure having a first hole portion and a second hole portion connected to and over the first hole portion in a semiconductor device includes forming a first etch mask over the stack structure. The first etch mask may have a first mask opening that has a first lateral dimension. The method may also include removing a portion of the stack structure exposed by the first etch mask to form an initial hole structure having an initial depth and the first lateral dimension. The initial depth may be equal to or greater than a depth of the first hole portion. The method may also include patterning the first etch mask to form a second etch mask. The first mask opening may be patterned to form a second mask opening that has a second lateral dimension, the second lateral dimension being greater than the first lateral dimension. The method may further include removing another portion of the stack structure exposed by the second etch mask to form a first initial hole portion having the first lateral dimension and a second initial hole portion having the second lateral dimension over and connected to the first initial hole portion. The method may further include performing a time-controlled etch and/or a spectrum endpoint controlled etch on the first and second initial hole portions until a bottom surface of the first initial hole portion reaches an etch stop layer of the stack structure, and the first initial hole portion and the second initial hole portion each reaches a respective depth of the first hole portion and the second hole portion. The first initial hole portion and the second initial hole portion may respectively form the first hole portion and the second hole portion.

In some embodiments, forming the first etch mask includes forming a hard mask layer over the stack structure and a soft mask layer over the hard mask layer. An etch resistivity of the soft mask layer may be lower than an etch resistivity of the hard mask layer. Forming the first etch mask may also include patterning the soft mask layer to form a first patterned soft mask layer, and removing portions of the hard mask layer exposed by the first patterned soft mask layer to form a first patterned hard mask layer. In some embodiments, forming the second etch mask includes patterning the first patterned soft mask layer to form a second patterned soft mask layer and removing portions of the first patterned hard mask layer exposed by the second patterned soft mask layer to form a second patterned hard mask layer.

In some embodiments, forming the hard mask layer includes forming a carbon-containing material layer. A carbon content of the carbon-containing material layer may be inversely proportional to a difference between the first lateral dimension and the second lateral dimension.

In some embodiments, forming the hard mask layer includes forming a spin-on-carbon layer, an amorphous carbon layer, a carbon compound layer, or a combination thereof.

In some embodiments, patterning the first etch mask includes performing an isotropic etching process and/or an anisotropic etching process to remove a portion of the first mask opening to form the second mask opening.

In some embodiments, forming the soft mask layer includes forming a photoresist layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a hole structure in a semiconductor device using a single photolithography process, comprising:
    forming an etch mask having a hard mask layer and a photoresist layer, wherein the hard mask layer is formed directly on a stack structure and the photoresist layer is formed on the hard mask layer, the stack structure including a plurality of sublayers stacked above an etch stop layer;
    patterning the photoresist layer using the single photolithography process to form a first pattern over the hard mask layer; and
    removing portions of the hard mask layer exposed by the first pattern of the photoresist layer, such that remaining portions of the hard mask layer and the photoresist layer form the etch mask having a mask opening with a first lateral dimension;
    removing a portion of the stack structure exposed by the mask opening to form an initial hole structure, the initial hole structure partially through an intermediate one of the plurality of sublayers of the stack structure without exposing or penetrating the etch stop layer of the stack structure;
    after forming the initial hole structure, enlarging the mask opening of the etch mask, including using an oxygen plasma etching process to form a second pattern in the photoresist layer and removing portions of the hard mask layer exposed by the second pattern of the photoresist layer to form an enlarged mask opening in the etch mask, the enlarged mask opening having a second lateral dimension that is greater than the first lateral dimension; and
    removing an other portion of the stack structure exposed by the enlarged mask opening to form the hole structure from the initial hole structure, the hole structure having a first hole portion and a second hole portion connected to and over the first hole portion, a bottom of the hole structure exposing the etch stop layer.

2. The method of claim 1, wherein removing the portion of the stack structure exposed by the mask opening comprises etching the stack structure using the etch mask as a respective etch mask to form the initial hole structure.

3. The method of claim 2, wherein removing the other portion of the stack structure exposed by the enlarged mask opening comprises etching the stack structure using the enlarged mask opening to form the first hole portion below the initial hole structure, and the second hole portion connected to and over the first hole portion.

4. The method of claim 3, wherein removing the other portion of the stack structure exposed by the enlarged mask opening further comprises etching the stack structure until a bottom of the first hole portion reaches the etch stop layer of the stack structure and a lateral dimension of the second hole portion equals the second lateral dimension.

5. A method for forming a hole structure in a semiconductor device using a single photolithography process, comprising:
    forming an etch mask directly on a stack structure using a first patterning process, the etch mask having a hard mask layer directly on the stack structure and a photoresist layer on the hard mask layer, the stack structure including a plurality of sublayers stacked above an etch stop layer, the etch mask having a mask opening with a first lateral dimension, wherein the first patterning process comprises:
        patterning the photoresist layer using the single photolithography process to form a first pattern over the hard mask layer; and
        forming, using the patterned photoresist layer as a mask and an etching process, a patterned hard mask layer directly on the stack structure, wherein the patterned photoresist layer and the patterned hard mask layer together form the etch mask;
    removing a portion of the stack structure exposed by the mask opening to form an initial hole structure, the initial hole structure partially through an intermediate one of the plurality of sublayers of the stack structure without exposing or penetrating the etch stop layer of the stack structure;
    after forming the initial hole structure, enlarging the mask opening of the etch mask by using an oxygen plasma etching process to etch the photoresist layer and the hard mask layer, to form an enlarged mask opening in the etch mask, the enlarged mask opening having a second lateral dimension that is greater than the first lateral dimension; and
    removing an other portion of the stack structure exposed by the enlarged mask opening to form the hole structure having a first hole portion and a second hole portion connected to and over the first hole portion, a bottom of the hole structure exposing the etch stop layer.

6. The method of claim 5, wherein removing the portion of the stack structure exposed by the mask opening comprises etching the stack structure using the etch mask as a respective etch mask to form the initial hole structure.

7. The method of claim 6, wherein removing the other portion of the stack structure exposed by the enlarged mask opening comprises etching the stack structure using the enlarged mask opening to form the first hole portion below the initial hole structure, and the second hole portion connected to and over the first hole portion.

8. The method of claim 7, wherein removing the other portion of the stack structure exposed by the enlarged mask opening further comprises etching the stack structure until a bottom of the first hole portion reaches the etch stop layer of the stack structure and a lateral dimension of the second hole portion equals the second lateral dimension.

9. A method for forming a hole structure in a semiconductor device using a single photolithography process, comprising:
    forming a patterned soft mask layer by using the photolithography process to expose a hard mask layer;
    forming, using the patterned soft mask layer as a mask and an etching process, a patterned hard mask layer directly on a stack structure, wherein the patterned soft mask layer and the patterned hard mask layer together form an etch mask with a mask opening having a first lateral dimension;
    removing a portion of the stack structure exposed by the mask opening to form an initial hole structure inside the stack structure;
    enlarging the mask opening of the etch mask, using a plasma etching process to the patterned soft mask layer and a dry etching process to the patterned hard mask layer, to form an enlarged mask opening in the etch mask, wherein the enlarged mask opening has a second lateral dimension that is greater than the first lateral dimension, and the enlarged mask opening exposes the initial hole structure; and removing an other portion of the stack structure exposed by the enlarged mask opening to form the hole structure from the initial hole structure, the hole structure having a first hole portion and a second hole portion connected to and over the first hole portion, a bottom of the hole structure exposing the etch stop layer.

10. The method of claim 9, wherein removing the portion of the stack structure exposed by the mask opening comprises etching the stack structure using the etch mask as a respective etch mask to form the initial hole structure.

11. The method of claim 10, wherein removing the other portion of the stack structure exposed by the enlarged mask opening comprises etching the stack structure using the enlarged mask opening to form the first hole portion below the initial hole structure, and the second hole portion connected to and over the first hole portion.

12. The method of claim 11, wherein removing the other portion of the stack structure exposed by the enlarged mask opening further comprises etching the stack structure until a bottom of the first hole portion reaches the etch stop layer of the stack structure and a lateral dimension of the second hole portion equals the second lateral dimension.

13. The method of claim 9, wherein forming the patterned hard mask layer directly on the stack structure comprises forming a spin-on-carbon layer, an amorphous carbon layer, a carbon compound layer, or a combination thereof.

14. The method of claim 1, wherein forming the hard mask layer comprises forming a carbon-containing material layer, a carbon content of the carbon-containing material layer being inversely proportional to a difference between the first lateral dimension and the second lateral dimension.

15. The method of claim 14, wherein forming the hard mask layer comprises forming a spin-on-carbon layer, an amorphous carbon layer, a carbon compound layer, or a combination thereof.

16. The method of claim 1, wherein forming the hard mask layer comprises forming an anti-reflective layer, a silicon nitride layer, a silicon oxynitride layer, or a combination.

17. The method of claim 5, wherein forming the patterned hard mask layer comprises forming a carbon-containing material layer, a carbon content of the carbon-containing material layer being inversely proportional to a difference between the first lateral dimension and the second lateral dimension.

18. The method of claim 17, wherein forming the patterned hard mask layer comprises forming a spin-on-carbon layer, an amorphous carbon layer, a carbon compound layer, or a combination thereof.

19. The method of claim 5, wherein forming the patterned hard mask layer comprises forming an anti-reflective layer, a silicon nitride layer, a silicon oxynitride layer, or a combination.

20. The method of claim 9, wherein forming the patterned hard mask layer directly on the stack structure comprises forming a carbon-containing material layer, a carbon content of the carbon-containing material layer being inversely proportional to a difference between the first lateral dimension and the second lateral dimension.

* * * * *